(12) United States Patent
Cho

(10) Patent No.: US 9,236,111 B2
(45) Date of Patent: Jan. 12, 2016

(54) SEMICONDUCTOR DEVICE

(71) Applicant: SK hynix Inc., Icheon-si Gyeonggi-do (KR)

(72) Inventor: Yong Deok Cho, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 82 days.

(21) Appl. No.: 14/320,202

(22) Filed: Jun. 30, 2014

(65) Prior Publication Data

US 2015/0262646 A1    Sep. 17, 2015

(30) Foreign Application Priority Data

Mar. 14, 2014   (KR) ........................ 10-2014-0030354

(51) Int. Cl.
| | | |
|---|---|---|
| *G11C 11/4076* | (2006.01) | |
| *G11C 11/4096* | (2006.01) | |
| *G11C 5/04* | (2006.01) | |
| *G11C 5/06* | (2006.01) | |
| *G11C 7/10* | (2006.01) | |
| *G11C 7/22* | (2006.01) | |

(52) U.S. Cl.
CPC .............. *G11C 11/4076* (2013.01); *G11C 5/04* (2013.01); *G11C 5/063* (2013.01); *G11C 7/1066* (2013.01); *G11C 7/1093* (2013.01); *G11C 7/222* (2013.01); *G11C 11/4096* (2013.01)

(58) Field of Classification Search
CPC ........................ G11C 11/4076; G11C 11/4096
See application file for complete search history.

(56) References Cited

U.S. PATENT DOCUMENTS

| | | | | |
|---|---|---|---|---|
| 7,835,218 | B2 * | 11/2010 | Ko ............................ | G11C 8/12 365/230.03 |
| 8,472,279 | B2 | 6/2013 | Swanson | |
| 2010/0188910 | A1 | 7/2010 | Kizer | |
| 2013/0294174 | A1 * | 11/2013 | Oh ........................ | G11C 7/1006 365/189.02 |
| 2014/0043926 | A1 * | 2/2014 | Kim ......................... | G11C 7/22 365/194 |
| 2014/0050021 | A1 * | 2/2014 | Kim ......................... | G11C 7/00 365/163 |
| 2014/0063977 | A1 * | 3/2014 | Park .................... | G11C 11/4076 365/189.05 |

* cited by examiner

*Primary Examiner* — Huan Hoang
*Assistant Examiner* — Tri Hoang
(74) *Attorney, Agent, or Firm* — William Park & Associates Ltd.

(57) ABSTRACT

A semiconductor device may include a write control block configured to generate a plurality of write enable signals for controlling a write operation, and a write delay block configured to apply delay times to a plurality of write data which are transmitted through a write global input/output line. The semiconductor device may also include a plurality of banks configured to operate in response to the plurality of write enable signals and receive the plurality of write data, wherein the plurality of write data have different delay times according to physical positions of the plurality of banks.

20 Claims, 6 Drawing Sheets

SEMICONDUCTOR DEVICE

CROSS-REFERENCES TO RELATED APPLICATION

The present application claims priority under 35 U.S.C. §119(a) to Korean application number 10-2014-0030354, filed on Mar. 14, 2014, in the Korean Intellectual Property Office, which is incorporated herein by reference in its entirety.

BACKGROUND

1. Technical Field

Various embodiments generally relate to a semiconductor device, and more particularly, to a technology for improving the timing skew of an input/output line.

2. Related Art

Semiconductor memory devices are being developed to increase the degree of integration and the operating speeds of the semiconductor memory devices. In order to increase operating speeds of the semiconductor memory devices a synchronous memory device has been developed. This synchronous memory device is capable of operating in synchronization with a clock signal received from outside the memory chip.

For example, a SDR (single data rate) synchronous memory device may be implemented whereby data is inputted and outputted through a single data pin during a single clock cycle. In the SDR synchronous memory device the input and output of the data is in synchronization with the rising edge of the clock signal.

However, the SDR synchronous memory device has difficulty operating with systems which require high speed operations. Accordingly, a DDR (double data rate) synchronous memory device may be implemented whereby data is consecutively inputted and outputted through each data input/output pin, in synchronization with the rising edge and the falling edge of a clock signal.

As such, a bandwidth at least two times wider than the conventional SDR synchronous memory device may be realized without increasing the frequency of a clock signal, and thus, a high speed operation may be achieved.

A DDR synchronous memory device adopts a multi-bit prefetch scheme in which multiple bits are internally processed at a time. The multi-bit prefetch scheme refers to a scheme in which data that is sequentially inputted are arranged in parallel in synchronization with a data strobe signal. Then the multi-bit data arranged in this way is stored at a time in a memory cell array by a write command which is inputted in synchronization with an external clock signal.

SUMMARY

In an embodiment, a semiconductor device may include a write control block configured to generate a plurality of write enable signals for controlling a write operation, and a write delay block configured to apply delay times to a plurality of write data which are transmitted through a write global input/output line. The semiconductor device may also include a plurality of banks configured to operate in response to the plurality of write enable signals and receive the plurality of write data, wherein the plurality of write data have different delay times according to physical positions of the plurality of banks.

In an embodiment, a semiconductor device may include a plurality of banks divided into first group banks and second group banks according to physical positions of the banks, and configured to generate a plurality of read control signals for controlling a read strobe operation, and a read delay block configured to apply delay times to a plurality of read data which are read from the plurality of banks, for the respective banks, and output the read data to a read global input/output line. A semiconductor device may also include a read signal combination block configured to combine the plurality of read control signals of the first group banks and the second group banks, and a combination block configured to combine outputs of the read signal combination block and output a combination signal.

In an embodiment, a semiconductor device may include a plurality of banks divided into first group banks and second group banks according to physical positions of the banks, the plurality of banks configured to be inputted with a plurality of write data which are applied through a write global input/output line, and the banks configured to generate a plurality of read control signals for controlling a read strobe operation, and a write circuit configured to generate a plurality of write enable signals for controlling a write operation, apply different control delay times to the plurality of write data which are transmitted to the write global input/output line, and output the write data to the plurality of banks. A semiconductor device may also include a read circuit configured to apply different control delay times to a plurality of read data which are read from the plurality of banks, for the respective banks, output the read data to a read global input/output line, and divide and combine the plurality of read control signals by the first group banks and the second group banks.

Additionally, in an embodiment, the write control block may be disposed in a center region of the write global input/output line such that the first group banks and the second group banks are distinguished on a layout.

Additionally, in an embodiment, the combination block may be disposed in a center region of the layout between the first group banks and the second group banks.

Additionally, in an embodiment, a first group read signal combination block may be disposed in the center region of the layout between the first group banks and the second group banks.

Additionally, in an embodiment, a second group read signal combination block may be disposed in the center region of the layout between the first group banks and the second group banks.

Additionally, in an embodiment, a first RGIO alignment block may be disposed in a center region of the RGIO of the layout.

Additionally, in an embodiment, a second RGIO alignment block may be disposed adjacent to a peripheral circuit block.

Additionally, in an embodiment, a write control block may be disposed adjacent to a center region of the write global input/output line such that the layout of the first group banks and the second group banks are divided.

BRIEF DESCRIPTION OF THE DRAWINGS

In general, in the case where the size of a semiconductor device such as a DRAM (dynamic random access memory) increases in the long side thereof, memory banks may be disposed in line. In these cases, physically, the length of a write global input/output line (WGIO) and a read global input/output line (RGIO) may be lengthened. Due to this fact, timing skews may increase in the respective memory banks, and an adverse influence may be exerted on a high frequency operation characteristic of the semiconductor device.

DETAILED DESCRIPTION

Hereinafter, semiconductor devices will be described below with reference to the accompanying drawings through various examples of embodiments.

For example but not limited to, a semiconductor device capable of decreasing the timing skews of a write global input/output line (WGIO) and a read global input/output line (RGIO) for respective banks may be described herein.

Figure 1:
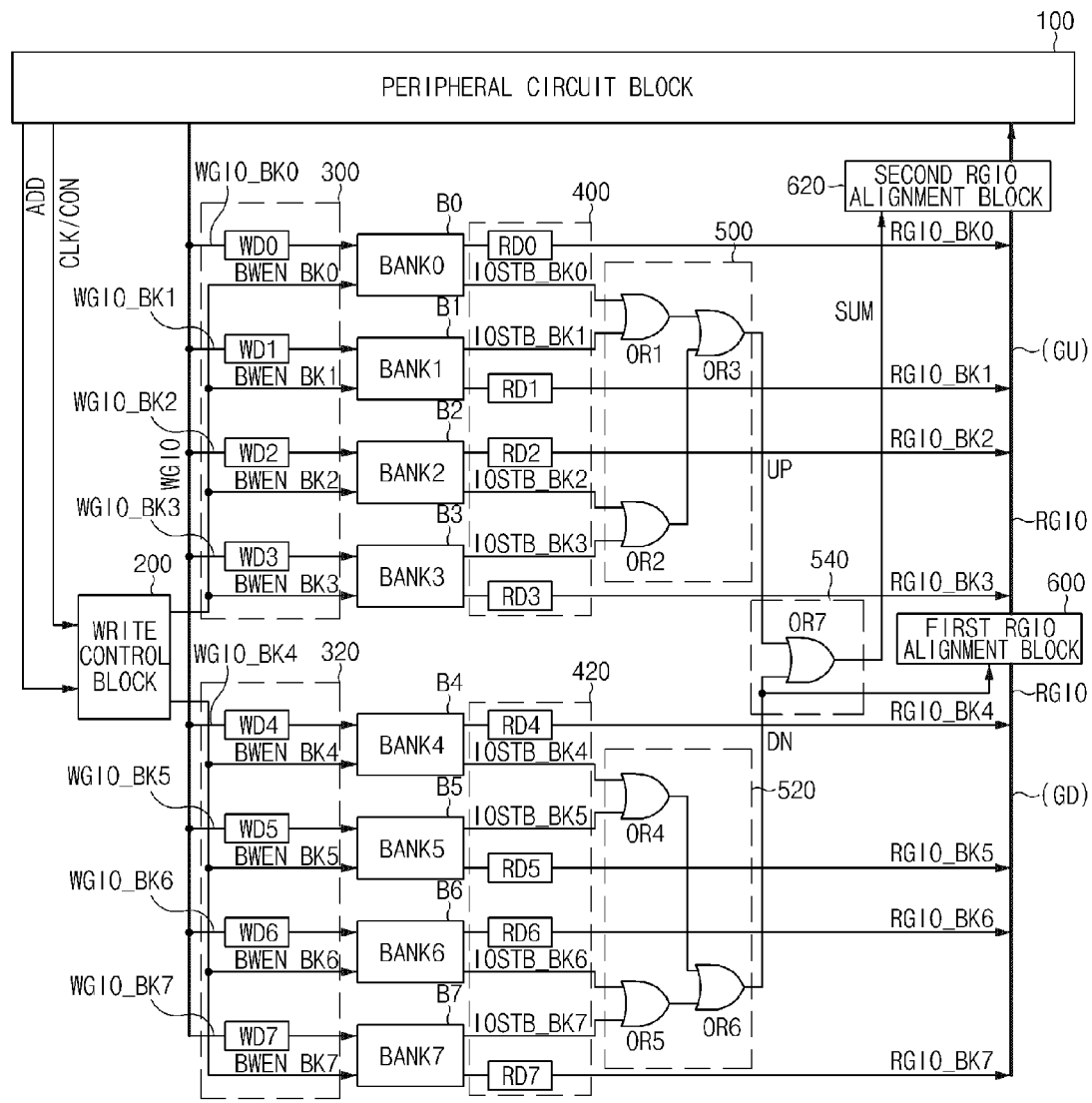
FIG. 1 is a configuration diagram illustrating a representation of an example of a semiconductor device in accordance with an embodiment.

FIG. 1 is a configuration diagram illustrating a representation of an example of a semiconductor device in accordance with an embodiment.

A semiconductor device in accordance with an embodiment may include a peripheral circuit block 100 and a write control block 200. The semiconductor device may also include write delay blocks 300 and 320, a plurality of banks B0 to B7, and read delay blocks 400 and 420. The semiconductor device may include read signal combination blocks 500 and 520, a combination block 540, and a first RGIO (read global input/output line) alignment block 600. The semiconductor device may also include a second RGIO alignment block 620.

In an embodiment, the configurations of the write control block 200 and the write delay blocks 300 and 320 may be referred to as a "write circuit." In an embodiment the configurations of the read delay blocks 400 and 420, the read signal combination blocks 500 and 520, the combination block 540, the first RGIO alignment block 600 and the second RGIO alignment block 620 may be referred to as a "read circuit".

The write control block 200 outputs write enable signals BWEN_BK0 to BWEN_BK7 for controlling a write operation. These write enable signals BWEN_BK0 to BWEN_BK7 may be received by the plurality of banks B0 to B7 in accordance with an address ADD, a clock CLK and a control signal CON which are applied from the peripheral circuit block 100 to the write control block 200. While it is described in an embodiment for the sake of convenience with regards to the explanation that 8 banks are used, it is to be noted that an embodiment is not limited to such and the number of banks is not specifically restricted.

The respective banks B0 to B7 may be inputted with write data WGIO_BK0 to WGIO_BK7 through a write global input/output line WGIO. The write delay blocks 300 and 320 may output the write data WGIO_BK0 to WGIO_BK7 by differentiating the delay times of the write data WGIO_BK0 to WGIO_BK7 for the respective banks B0 to B7.

The write delay blocks 300 and 320 may be divided into a first group write delay block 300, and a second group write delay block 320. The first group write delay block 300 may include delay units WD0 to WD3 which are disposed in the upper region of the layout when viewed from the position of the write control block 200. The second group write delay block 320 may include delay units WD4 to WD7 which are disposed in the lower region of the layout when viewed from the position of the write control block 200.

The write control block 200 serves as a reference for distinguishing the first group write delay block 300 and the second group write delay block 320. The write control block 200 may be, for example but not limited to being, disposed adjacent to the center region of the write global input/output line WGIO on the layout.

The write global input/output line WGIO at positions connected with the first group banks B0 to B3 may be assumed to be an upper write global line. The write global input/output line WGIO at positions connected with the second group banks B4 to B7 may be assumed to be a lower write global line. It may be assumed that the write global input/output line WGIO is in a normal direction when it is disposed in the vertical direction with respect to the peripheral circuit block 100.

The write control block 200 may be disposed in the center region of the layout to distinguish the upper write global line and the lower write global line such that the lengths of the upper write global line and the lower write global line become the same with or similar to each other. In other words, the write control block 200 is disposed in the center region such that the upper write delay block 300 and the lower write delay block 320 are physically and substantially symmetrical to each other.

Assumptions may be made for the cases where the write data WGIO_BK0 to WGIO_BK3 are transmitted from the peripheral circuit block 100 to the first group banks B0 to B3. In these cases, it may be assumed that the transmission time of the write data WGIO_BK0, from the peripheral circuit block 100 to the bank B0, is the quickest and requires the least amount of transmission time because bank B0 compared to the other banks is disposed physically closest to the peripheral circuit block 100. Conversely, it may be assumed that the transmission time of the write data WGIO_BK3, from the peripheral circuit block 100 to the bank B3, is the slowest and requires the most amount of transmission time because bank B3 is disposed physically farthest from the peripheral circuit block 100.

Further, assumptions may be made for the cases where the write data WGIO_BK4 to WGIO_BK7 are transmitted from the peripheral circuit block 100 to the second group banks B4 to B7. In these cases, it may be assumed that the transmission time of the write data WGIO_BK4, from the peripheral circuit block 100 to the bank B4, is the quickest and requires the least amount of transmission time because bank B4 compared to the other banks is disposed physically closest to the peripheral circuit block 100. Conversely, it may be assumed that the transmission time of the write data WGIO_BK7, from the peripheral circuit block 100 to the bank B7, is the slowest and requires the most amount of transmission time because bank B7 is disposed physically farthest from the peripheral circuit block 100.

In such cases, timing margin differences may be induced between the write data WGIO_BK0 to WGIO_BK7 applied through the write global input/output line WGIO and the write enable signals BWEN_BK0 to BWEN_BK7 in the write operation. In consideration of this fact, timing skews for the respective banks B0 to B7 may be compensated for through the delay circuits of the write delay blocks 300 and 320.

For example, the delay unit WD0 disposed closest to the peripheral circuit block 100 may be set to cause the longest delay time among the first group delay units WD0 to WD3. Conversely, the delay unit WD3 disposed farthest from the peripheral circuit block 100 may be set to cause the shortest delay time among the first group delay units WD0 to WD3. Due to the first group delay units WD0 to WD3, the transmission time of the write data WGIO_BK0 to WGIO_BK3, from the peripheral circuit block 100 to the banks B0 to B3, may require the same or substantially the same amount of transmission time regardless of the distances between the banks B0 to B3 and the peripheral circuit block 100.

Also, the delay unit WD4 disposed closest to the peripheral circuit block 100 may be set to cause the longest delay time among the second group delay units WD4 to WD7. Conversely, the delay unit WD7 disposed farthest from the peripheral circuit block 100 may be set to cause the shortest delay time among the second group delay units WD4 to WD7. Due to the second group delay units WD4 to WD7, the transmission time of the write data WGIO_BK4 to WGIO_BK7, from the peripheral circuit block 100 to the banks B4 to B7, may require the same or substantially the same amount of transmission time regardless of the distances between the banks B4 to B7 and the peripheral circuit block 100.

In an embodiment, adjustments may be made or applied in such a way that, among the entire delay units WD0 to WD7, the first delay unit WD0 may have the longest delay time, and that the delay times of the units are sequentially shortened whereby the last delay unit WD7 has the shortest delay time. In other words, the delay times of the delay units WD0 to WD7 may be controlled or set in such a way as to correspond to a transmission time that is required for the write data WGIO_BK7 to be transmitted from the peripheral circuit block 100 to the lowermost bank B7.

In an embodiment, the configurations of the write delay blocks 300 and 320 are formed outside the respective banks B0 to B7. However, it is to be noted that an embodiment is not limited to such examples and the configurations of the write delay blocks 300 and 320 may be formed inside the respective banks B0 to B7.

The plurality of banks B0 to B7 may be divided into the first group banks B0 to B3 and the second group banks B4 to B7. The write control block 200 may provide the address ADD, the clock CLK, and the control signal CON divisionally to the first group banks B0 to B3 and the second group banks B4 to B7. The write control block 200 may separately provide the address ADD, the clock CLK, and the control signal CON to the first group banks B0 to B3 as opposed to providing the address ADD, the clock CLK, and the control signal CON to both the first group banks B0 to B3 and the second group banks B4 to B7. Likewise, the write control block 200 may separately provide the address ADD, the clock CLK, and the control signal CON to the second group banks B4 to B7 as opposed to providing the address ADD, the clock CLK, and the control signal CON to both the first group banks B0 to B3 and the second group banks B4 to B7.

The first group banks B0 to B3 are disposed in the upper region of the layout when viewed from the positions of the write control block 200, the combination block 540, and the first RGIO alignment block 600. The second group banks B4 to B7 are disposed in the lower region of the layout when viewed from the positions of the write control block 200, the combination block 540, and the first RGIO alignment block 600.

The read delay blocks 400 and 420 cause the delay times of read data RGIO_BK0 to RGIO_BK7 which are read from the plurality of banks B0 to B7, to be different from one another for the respective banks B0 to B7. The read delay blocks 400 and 420 output the read data RGIO_BK0 to RGIO_BK7 to a read global input/output line RGIO. In this regard, according to an embodiment, timing skews occurring between the respective banks B0 to B7 and the read global input/output line RGIO in a read operation may be compensated for.

The read delay blocks 400 and 420 may be divided into a first group read delay block 400 and a second group read delay block 420. The first group read delay block 400 may include delay units RD0 to RD3 which are disposed in the upper region of the layout when viewed from the position of the combination block 540. The second group read delay block 420 may include delay units RD4 to RD7 which are disposed in the lower region of the layout when viewed from the position of the combination block 540.

The first group read delay block 400 may be connected with the first group banks B0 to B3 in one-to-one correspondence. The second group read delay block 420 may be connected with the second group banks B4 to B7 in one-to-one correspondence.

In an embodiment the configurations of the read delay blocks 400 and 420 may be formed outside the respective banks B0 to B7. However, it is to be noted that an embodiment is not limited to such examples and the configurations of the read delay blocks 400 and 420 may be formed inside the respective banks B0 to B7.

The respective banks B0 to B7 may generate read control signals IOSTB_BK0 to IOSTB_BK7 for controlling a read strobe operation. The read control signals IOSTB_BK0 to IOSTB_BK7 generated by the respective banks B0 to B7 are outputted to the read signal combination blocks 500 and 520.

The read signal combination blocks 500 and 520 may sense the activated states of the read control signals IOSTB_BK0 to IOSTB_BK7, and output resultant signals to the combination block 540. The read signal combination blocks 500 and 520 may be divided into a first group read signal combination block 500 and a second group read signal combination block 520.

The first group read signal combination block 500 may combine the read control signals IOSTB_BK0 to IOSTB_BK3 which are applied from the first group banks B0 to B3, and may output an upper strobe enable signal UP to the combination block 540. The second group read signal combination block 520 may combine the read control signals IOSTB_BK4 to IOSTB_BK7 which are applied from the second group banks B4 to B7, and may output a lower strobe enable signal DN to the combination block 540.

The read signal combination block 500 may include logic gates, for example but not limited to, a plurality of OR gates OR1 to OR3 which logically combine the read control signals IOSTB_BK0 to IOSTB_BK3. The OR gate OR1 "ORs" or performs an OR logic function on the read control signals IOSTB_BK0 and IOSTB_BK1. The OR gate OR2 "ORs" or performs an OR logic function on the read control signals IOSTB_BK2 and IOSTB_BK3. The OR gate OR3 "ORs" or performs an OR logic function on the outputs of the OR gates OR1 and OR2, and outputs the upper strobe enable signal UP.

The read signal combination block 500 activates the upper strobe enable signal UP to a high level and outputs the activated upper strobe enable signal UP, when at least any one signal of the plurality of read control signals IOSTB_BK0 to IOSTB_BK3 is activated to a high level.

The read signal combination block 520 includes a plurality of OR gates OR4 to OR6 which logically combine the read control signals IOSTB_BK4 to IOSTB_BK7. The OR gate OR4 "ORs" or performs an OR logic function on the read control signals IOSTB_BK4 and IOSTB_BK5. The OR gate OR5 "ORs" or performs an OR logic function on the read control signals IOSTB_BK6 and IOSTB_BK7. The OR gate OR6 "ORs" or performs an OR logic function on the outputs of the OR gates OR4 and OR5, and outputs the lower strobe enable signal DN.

The read signal combination block 520 activates the lower strobe enable signal DN to a high level and outputs the activated lower strobe enable signal DN, when at least any one signal of the plurality of read control signals IOSTB_BK4 to IOSTB_BK7 is activated to a high level.

The combination block 540 logically calculates the upper strobe enable signal UP and the lower strobe enable signal DN which are applied from the read signal combination blocks 500 and 520, and outputs a combination signal SUM. The combination block 540 includes an OR gate OR7. The OR gate OR7 "ORs" or performs an OR logic function on the upper strobe enable signal UP and the lower strobe enable signal DN and outputs the combination signal SUM.

The combination block 540 activates the combination signal SUM to a high level and outputs the activated combination signal SUM, when at least any one signal of the upper strobe enable signal UP and the lower strobe enable signal DN is activated to a high level.

The combination block 540 serves as a reference for distinguishing the first group read signal combination block 500 and the second group read signal combination block 520. The combination block 540 may be disposed adjacent to the center region of the read global input/output line RGIO on the layout.

The read global input/output line RGIO which is inputted with the read data RGIO_BK0 to RGIO_BK3 from the first group read signal combination block 500 is assumed as an upper read global line (GU). The read global input/output line RGIO which is inputted with the read data RGIO_BK4 to RGIO_BK7 from the second group read signal combination block 520 is assumed as a lower read global line (GD). It may be assumed that the read global input/output line RGIO is in a normal direction when it is disposed in the vertical direction with respect to the peripheral circuit block 100.

The combination block 540 may be disposed in the center region of the layout to distinguish the upper read global line (GU) and the lower read global line (GD) such that the lengths of the upper read global line (GU) and the lower read global line (GD) become the same with or similar to each other.

In other words, the combination block 540 may be disposed in the center region such that the upper read signal combination block 500 and the lower read signal combination block 520 are physically symmetrical to each other or substantially symmetrical to each other. In these cases, the lengths of the output line of the upper strobe enable signal UP which is outputted from the upper read signal combination block 500 and the output line of the lower strobe enable signal DN which is outputted from the lower read signal combination block 520 may be physically symmetrical with each other or substantially symmetrical with each other.

The first RGIO alignment block 600 and the second RGIO alignment block 620 align the read data RGIO_BK0 to RGIO_BK7 which are applied through the read global input/output line RGIO, and output the read data RGIO_BK0 to RGIO_BK7 to the peripheral circuit block 100. Namely, the lower group read data RGIO_BK4 to RGIO_BK7 are primarily aligned centrally through the first RGIO alignment block 600, and the entire group read data RGIO_BK0 to RGIO_BK7 are secondarily aligned through the second RGIO alignment block 620 adjacent to the peripheral circuit block 100.

The first RGIO alignment block 600 aligns the read data RGIO_BK4 to RGIO_BK7 applied to the lower read global line (GD), in correspondence to the lower strobe enable signal DN. The second RGIO alignment block 620 aligns the read data RGIO_BK0 to RGIO_BK3 applied to the upper read global line (GU) and the read data RGIO_BK4 to RGIO_BK7 applied through the first RGIO alignment block 600, and the second RGIO alignment block 620 outputs the read data RGIO_BK0 to RGIO_BK7 to the peripheral circuit block 100.

For example, the first RGIO alignment block 600 primarily aligns the four read data RGIO_BK4 to RGIO_BK7 belonging to the lower group, in correspondence to the lower strobe enable signal DN. The second RGIO alignment block 620 adds the four read data RGIO_BK4 to RGIO_BK7 applied from the first RGIO alignment block 600 and the four read data RGIO_BK0 to RGIO_BK3 applied to the upper read global line (GU), entirely aligns the total eight read data RGIO_BK0 to RGIO_BK7, and outputs them to the peripheral circuit block 100.

The second RGIO alignment block 620 may be disposed adjacent to the peripheral circuit block 100. The first RGIO alignment block 600 may be disposed in the center region of the layout to distinguish the upper read global line (GU) and the lower read global line (GD) such that the lengths of the upper read global line (GU) and the lower read global line (GD) become the same with or are similar to each other. That is to say, the first RGIO alignment block 600 may be disposed in the center region such that the upper read global line (GU) and the lower read global line (GD) are physically symmetrical to each other or substantially symmetrical to each other.

Figure 2:
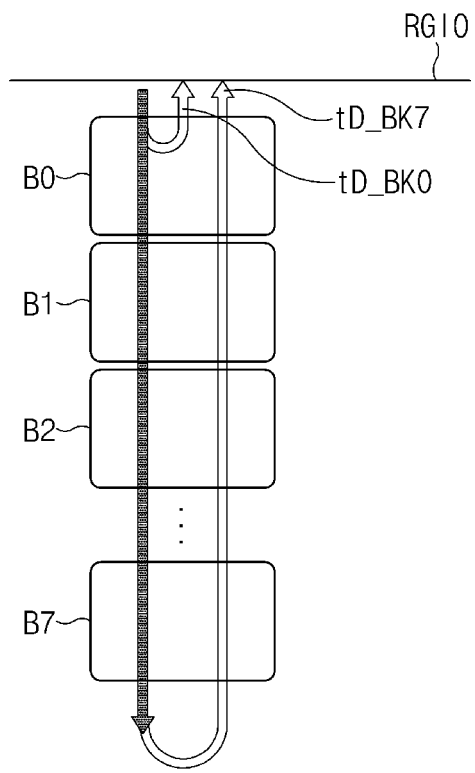
FIG. 2 is a diagram illustration to assist in explaining that timings at which read data are transmitted from respective banks to a read global input/output line during a read operation may be different.

FIG. 2 is a diagram illustration to assist in explaining that timings at which read data are transmitted from respective banks to a read global input/output line during a read operation are different.

In general, a time tD_BK0 required to transmit the read data RGIO_BK0 from the uppermost disposed bank B0 to the read global input/output line RGIO may be the shortest. Conversely, a time tD_BK7 required to transmit the read data RGIO_BK7 from the lowermost disposed bank B7 to the read global input/output line RGIO may be the longest due to the bank B7 being physically further away from the read global input/output line RGIO than the bank B0. That is to say, in the case where the dispositions of respective banks physically have distance differences, timing skews may occur, perhaps the worst timing skews occurring with respect to a read operation.

When data transmission timings of the respective banks are different in this way, the value of the tCCD (CAS to CAS delay time) parameter in a bank interleave read operation may be degraded. In these cases, since the characteristic of the read global input/output line RGIO is degraded, the high speed operation of a semiconductor device may be difficult to perform.

Therefore, an embodiment may be applied to the case where the size of a chip in a memory product, such as a low power semiconductor device (for example, an LPDDR4), which supports a planar type stack package, increases in the long side thereof. In other words, physical delay skews according to the dispositions of the respective banks may be controlled.

In such an embodiment, respective banks include delay units which compensate for the timing skews of the write global input/output line WGIO and the read global input/ output line RGIO. Namely, in order to match the skews of input/output signals arranged long in one direction, delay elements for aligning the strobe signals of the write global input/output line WGIO and the read global input/output line RGIO are included.

In particular, the combination block 540 may be disposed in the center region such that the upper read signal combination block 500 and the lower read signal combination block 520 are physically symmetrical with each other or substantially symmetrical with each other in the read operation. Such a disposition scheme may be referred to as a fly-by scheme. That is to say, the data read from the respective banks may be aligned centrally through a logic circuit with a data chain scheme, and then, the aligned read data may be secondarily aligned.

Figure 3:
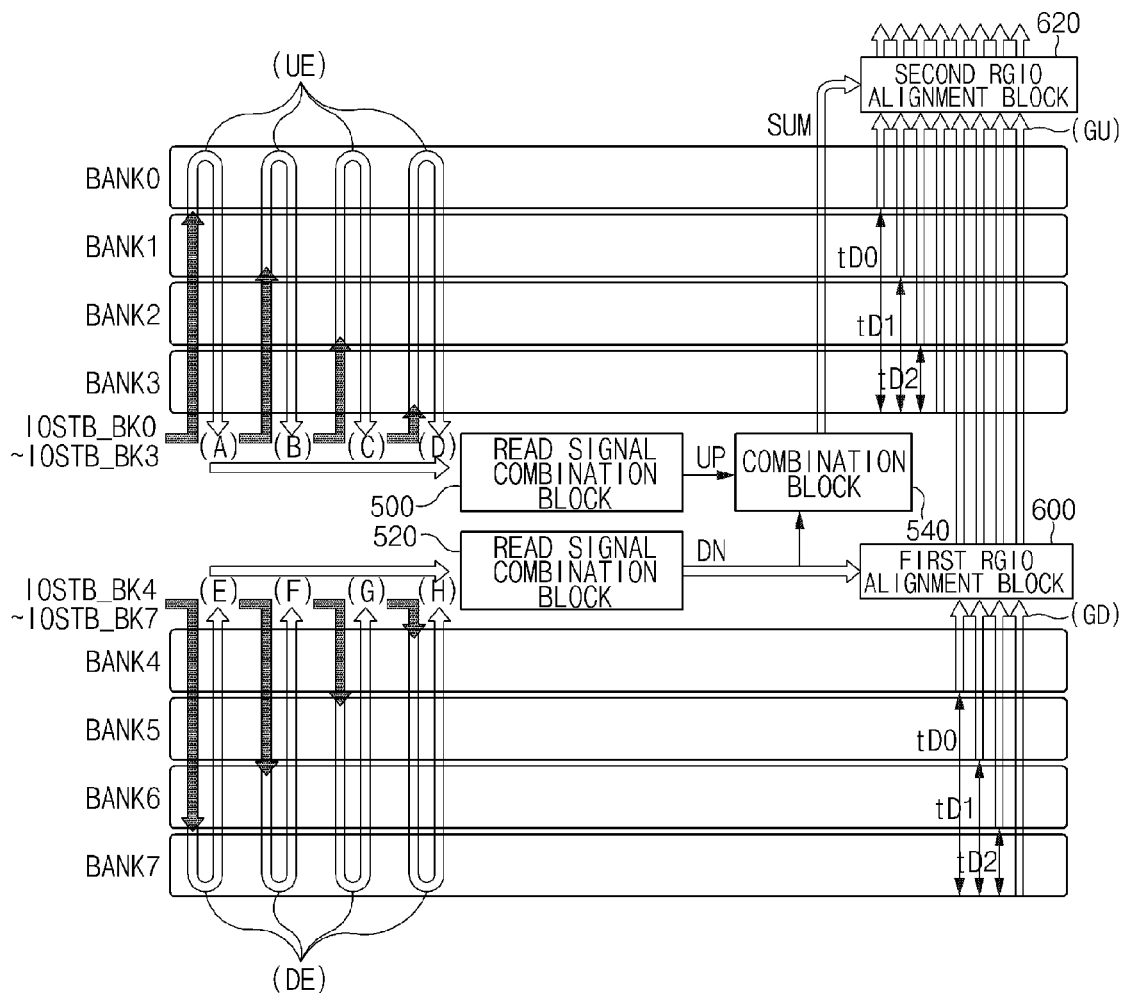
FIG. 3 is a representation of an example of a conceptual layout diagram to assist in the explanation of an operation for controlling delay matching of a read global input/output line for respective banks during a read operation in an embodiment.

FIG. 3 is a representation of an example of a conceptual layout diagram to assist in the explanation of an operation for controlling delay matching of a read global input/output line for respective banks during a read operation in an embodiment.

In an embodiment, the read signal combination block 500 may be positioned in the center region between the first group banks B0 to B3 and the second group banks B4 to B7. Further, the wiring lines of the read control signals IOSTB_BK0 to IOSTB_BK3, which are outputted from the first group banks B0 to B3, are caused to be positioned up to an upper edge region (UE) of the first bank B0 which is disposed at an uppermost position on the layout, in such a way as to be combined in a fly-by daisy chain. In these cases, even though the physical positions of the first group banks B0 to B3 are respectively different, the combination signal SUM may be activated with the same timing.

The daisy chain, as a term used in a computer structure, refers to a scheme in which all devices are connected in series based on a first priority. Herein, in the same manner as in the computer structure, the daisy chain is used as having a meaning that the delay timings of the read control signals IOSTB_BK0 to IOSTB_BK3 outputted from the first group banks B0 to B3 are controlled one right after another.

In an embodiment, the read signal combination block 520 may be positioned in the center region between the first group banks B0 to B3 and the second group banks B4 to B7. Further, the wiring lines of the read control signals IOSTB_BK4 to IOSTB_BK7, which are outputted from the second group banks B4 to B7, are caused to be positioned down to a lower edge region (DE) of the bank B7 which is disposed at a lowermost position on the layout, in such a way as to be combined in a fly-by daisy chain. In these cases, even though the physical positions of the second group banks B4 to B7 are respectively different, the combination signal SUM may be activated with the same timing.

The daisy chain, as a term used in a computer structure, refers to a scheme in which all devices are connected in series based on a first priority. Herein, in the same manner as in the computer structure, the daisy chain is used as having a meaning that the delay timings of the read control signals IOSTB_BK4 to IOSTB_BK7 outputted from the second group banks B4 to B7 are controlled one right after another.

As the operation speed of a memory system increases, the topology of a signal line may be changed to be better suited for a high speed operation. In an embodiment, due to the fly-by scheme of the read signal combination blocks 500 and 520, channels are formed in a daisy chain type. The read signal combination blocks 500 and 520 may improve the characteristics of the signal lines through impedance matching in a pattern in which they are connected to respective loadings through short stubs.

The signals transmitted to the OR gates OR3 and OR6 are combined by the combination block 540 which may be disposed in the center region of the banks B0 to B7, through the upper strobe enable signal UP and the lower strobe enable signal DN. Signals (A) to (D) outputted from the first group banks B0 to B3 are outputted to the combination block 540 as the upper strobe enable signal UP all at the same timing or substantially the same timing even though their physical positions are different from one another. Signals (E) to (H) outputted from the second group banks B4 to B7 are outputted to the combination block 540 as the lower strobe enable signal DN all at the same timing or substantially the same timing even though their physical positions are different from one another.

In these cases, substantial delay differences are not induced in the pulse timings of the read control signals IOSTB_BK0 to IOSTB_BK7 which are respectively generated in all of the respective banks B0 to B7. The first RGIO alignment block 600 aligns the data outputted from the second group banks B4 to B7, through the read global input/output line RGIO.

In other words, the first RGIO alignment block 600 primarily aligns the read control signals IOSTB_BK4 to IOSTB_BK7 through the lower read global line (GD) in response to the lower strobe enable signal DN. The first RGIO alignment block 600 compensates for differences in delay times tD0 to tD3 that are induced in the lower read global line (GD) according to the physical position of the lower read global line (GD) to which the read control signals IOSTB_BK4 to IOSTB_BK7 are respectively applied.

The second RGIO alignment block 620 secondarily aligns all the read control signals IOSTB_BK0 to IOSTB_BK7 through the upper read global line (GU) in response to the upper strobe enable signal UP and the lower strobe enable signal DN. The second RGIO alignment block 620 compensates for the differences in delay times tD0 to tD3 that are induced in the upper read global line (GU) according to the physical position of the upper read global line (GU) to which the read control signals IOSTB_BK0 to IOSTB_BK3 are respectively applied. In these cases, it may be possible to eliminate the timing skews of the read global input/output line RGIO corresponding to the physical disposition structure of the respective banks B0 to B7.

Figure 4:
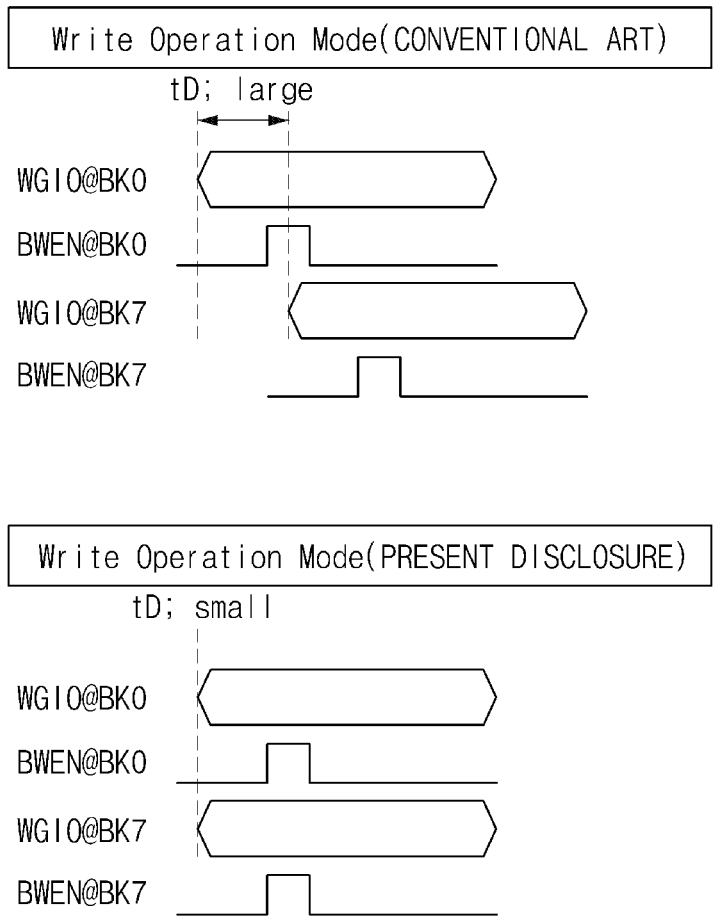
FIGS. 4 and 5 are timing diagram representations of examples for illustrating that timing skews may be improved in an embodiment.
Figure 5:
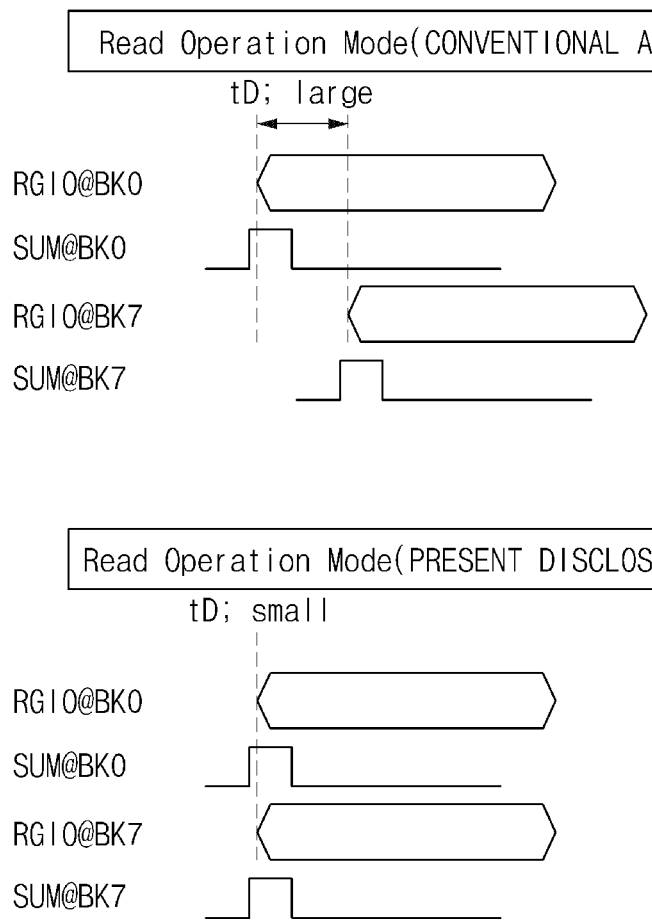

FIGS. 4 and 5 are timing diagram representations of examples for illustrating that timing skews may be improved in an embodiment. FIG. 4 is a diagram illustrating that a timing skew may be decreased in a write operation mode when compared to the conventional art, and FIG. 5 is a diagram illustrating that a timing skew may be decreased in a read operation mode when compared to the conventional art.

Referring to FIG. 4, it can be seen from the section entitle CONVENTIONAL ART that, in the conventional art, the delay timing skew between a write global input/output line WGIO@BK0 corresponding to a bank B0 and a write global input/output line WGIO@BK7 corresponding to a bank B7 is substantially large. However, it can be seen from the section entitle PRESENT DISCLOSURE that, in an embodiment of the present disclosure, the delay timing skew between a write global input/output line WGIO@BK0 corresponding to a bank B0 and a write global input/output line WGIO@BK7 corresponding to a bank B7 may not exist.

Referring to FIG. 5, it can be seen from the section entitled CONVENTIONAL ART that, in the conventional art, the delay timing skew between a read global input/output line RGIO@BK0 corresponding to a bank B0 and a read global input/output line RGIO@BK7 corresponding to a bank B7 is substantially large. However, it can be seen from the section entitled PRESENT DISCLOSURE that, in the embodiment of the present disclosure, the delay timing skew between a read global input/output line RGIO@BK0 corresponding to a bank B0 and a read global input/output line RGIO@BK7 corresponding to a bank B7 may not exist.

As is apparent from the above descriptions, an embodiment may provide an advantage in that, since the timing skews of a write global input/output line (WGIO) and a read global input/output line (RGIO) for respective banks may be decreased, reliability may be improved in a low power consumption high frequency operation.

Figure 6:
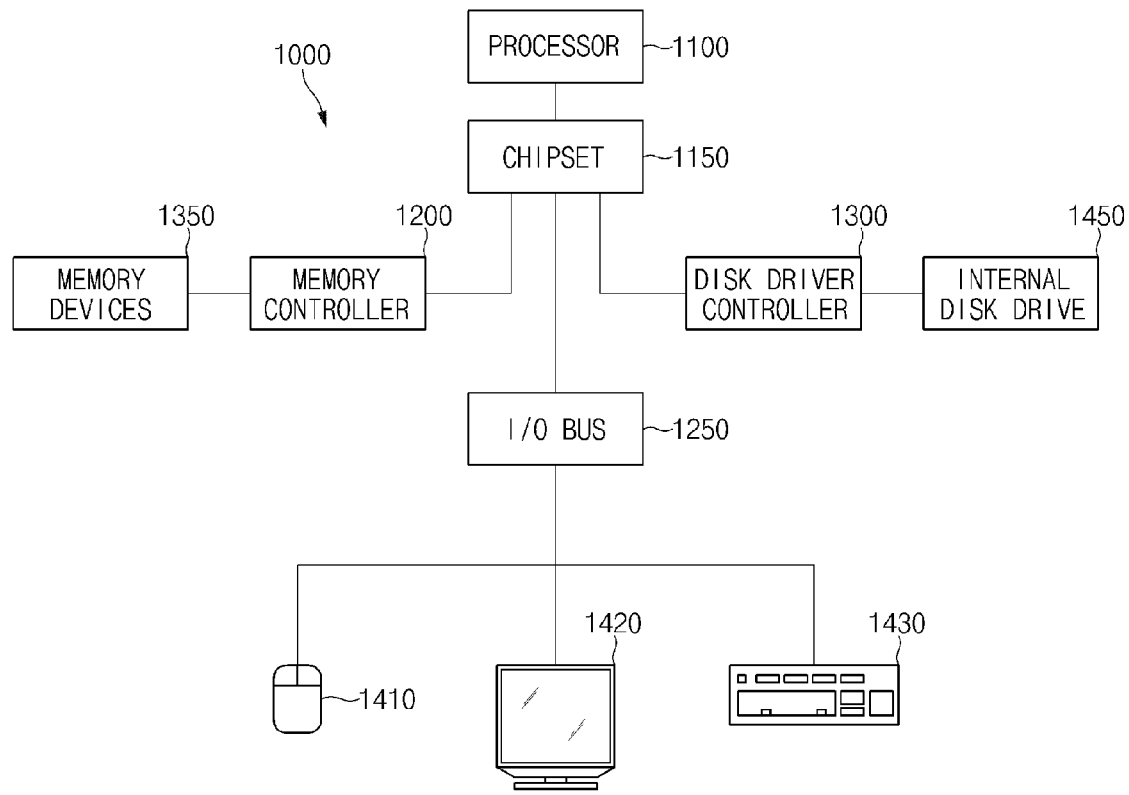
FIG. 6 illustrates a block diagram representation of an example of a system employing the semiconductor device in accordance with the embodiments discussed above with relation to FIGS. 1-3.

The semiconductor devices discussed above are particular useful in the design of memory devices, processors, and computer systems. For example, referring to FIG. 6, a block diagram of a system employing the semiconductor device in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device as discussed above with reference to FIGS. 1-3. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor device as discussed above with relation to FIGS. 1-3, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the semiconductor device as discussed above with relation to FIGS. 1-3. In alternate embodiments, such as cellular phones or digital cameras, the components may differ from the embodiments illustrated in FIG. 6

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
   a write control block configured to generate a plurality of write enable signals for controlling a write operation;
   a write delay block configured to apply delay times to a plurality of write data which are transmitted through a write global input/output line; and
   a plurality of banks configured to operate in response to the plurality of write enable signals and receive the plurality of write data,
   wherein the plurality of write data have different delay times according to physical positions of the plurality of banks.

2. The semiconductor device according to claim 1, wherein the plurality of write data are applied with different delay times.

3. The semiconductor device according to claim 2, wherein the plurality of banks are divided into first group banks and second group banks.

4. The semiconductor device according to claim 3, wherein the write delay block comprises:
   a first group write delay block configured to apply the different delay times to the plurality of write data and output the write data to the first group banks; and
   a second group write delay block configured to apply the different delay times to the plurality of write data and output the write data to the second group banks,
   wherein the first group write delay block is disposed in an upper region of the layout with respect to the write control block, and
   wherein the second group write delay block is disposed in a lower region of the layout with respect to the write control block.

5. The semiconductor device according to claim 3, wherein the first group banks are disposed in the upper region of the layout with respect to the write control block.

6. The semiconductor device according to claim 3, wherein the second group banks are disposed in the lower region of the layout with respect to the write control block.

7. A semiconductor device comprising:
   a plurality of banks divided into first group banks and second group banks according to physical positions of the banks, and configured to generate a plurality of read control signals for controlling a read strobe operation;
   a read delay block configured to apply delay times to a plurality of read data which are read from the plurality of banks, for the respective banks, and output the read data to a read global input/output line;
   a read signal combination block configured to combine the plurality of read control signals of the first group banks and the second group banks; and a combination block configured to combine outputs of the read signal combination block and output a combination signal.

8. The semiconductor device according to claim 7, wherein the plurality of read data are applied with different delay times.

9. The semiconductor device according to claim 7, wherein the read delay block comprises:
 a first group read delay block configured to apply the delay times to the read data which are outputted from the first group banks; and
 a second group read delay block configured to apply the delay times to the read data which are outputted from the second group banks,
 wherein the first group read delay block is disposed in an upper region of a layout with respect to the combination block, and
 wherein the second group read delay block is disposed in a lower region of a layout with respect to the combination block.

10. The semiconductor device according to claim 7, wherein the combination block is configured to activate the combination signal and output the activated combination signal, when at least any one signal of the plurality of read control signals is activated.

11. The semiconductor device according to claim 7, wherein the read signal combination block comprises:
 a first group read signal combination block configured to combine read control signals which are applied from the first group banks, and output an upper strobe enable signal; and
 a second group read signal combination block configured to combine read control signals which are applied from the second group banks, and output a lower strobe enable signal.

12. The semiconductor device according to claim 11, wherein the first group read signal combination block is configured to activate the upper strobe enable signal and output the activated upper strobe enable signal, when at least any one of the read control signals applied from the first group banks is activated,
 wherein the second group read signal combination block is configured to activate the lower strobe enable signal and output the activated lower strobe enable signal, when at least any one of the read control signals applied from the second group banks is activated.

13. The semiconductor device according to claim 11, wherein the first group read signal combination block causes wiring lines of the read control signals which are outputted from the first group banks, to be positioned up to an upper edge region of a first bank which is disposed at an uppermost position of the layout, and is configured to combine the read control signals in a fly-by daisy chain.

14. The semiconductor device according to claim 11, wherein the second group read signal combination block causes wiring lines of the read control signals which are outputted from the second group banks, to be positioned down to a lower edge region of a final bank which is disposed at a lowermost position of the layout, and is configured to combine the read control signals in a fly-by daisy chain.

15. The semiconductor device according to claim 7, further comprising:

a read global input/output line (RGIO) alignment block configured to align the plurality of read data which are transmitted to the read global input/output line.

16. The semiconductor device according to claim 15, wherein the RGIO alignment block comprises:
 a first RGIO alignment block configured to align output data of the second group read delay block in response to the lower strobe enable signal which is applied from the second group read signal combination block of the read signal combination block; and
 a second RGIO alignment block configured to align output data of the first group read delay block and output data of the first RGIO alignment block, in response to the combination signal.

17. A semiconductor device comprising:
 a plurality of banks divided into first group banks and second group banks according to physical positions of the banks, the plurality of banks configured to be inputted with a plurality of write data which are applied through a write global input/output line, and the banks configured to generate a plurality of read control signals for controlling a read strobe operation;
 a write circuit configured to generate a plurality of write enable signals for controlling a write operation, apply different control delay times to the plurality of write data which are transmitted to the write global input/output line, and output the write data to the plurality of banks; and
 a read circuit configured to apply different control delay times to a plurality of read data which are read from the plurality of banks, for the respective banks, output the read data to a read global input/output line, and divide and combine the plurality of read control signals by the first group banks and the second group banks.

18. The semiconductor device according to claim 17, wherein the write circuit comprises:
 a write control block configured to generate the plurality of write enable signals; and
 a write delay block configured to apply different delay times to the plurality of write data according to the physical positions.

19. The semiconductor device according to claim 17, wherein the read circuit comprises:
 a read delay block configured to apply different delay times to the plurality of read data, for the respective banks, and output the read data to the read global input/output line;
 a read signal combination block configured to combine the plurality of read control signals by the first group banks and the second group banks; and
 a combination block configured to combine outputs of the read signal combination block and output a combination signal.

20. The semiconductor device according to claim 17, wherein the read circuit further comprises:
 a first RGIO alignment block configured to align output data of a second group read delay block in response to a lower strobe enable signal which is applied from a second group read signal combination block of the read signal combination block; and
 a second RGIO alignment block configured to align output data of a first group read delay block and output data of the first RGIO alignment block, in response to the combination signal.

* * * * *